United States Patent [19]

Schmitz et al.

[11] 4,170,754
[45] Oct. 9, 1979

[54] PHASE ENCODED DIGITAL POSITION PROBE ASSEMBLY

[75] Inventors: Johannes J. Schmitz, Catonsville, Md.; Theodore M. Heinrich, Franklin Township, Cambria County, Pa.

[73] Assignee: Westinghouse Electric Corp., Pittsburgh, Pa.

[21] Appl. No.: 622,917

[22] Filed: Oct. 16, 1975

[51] Int. Cl.² .......................................... G21C 17/00
[52] U.S. Cl. ............................... 324/208; 176/19 R
[58] Field of Search .................. 235/92 GB, 92 MP; 324/34 PS, 34 D; 176/19, 36; 340/796, 199

[56] References Cited

U.S. PATENT DOCUMENTS

| | | | |
|---|---|---|---|
| 2,033,654 | 3/1936 | Selquist et al. | 324/34 PS |
| 2,991,632 | 10/1959 | Levine et al. | 340/196 |
| 3,684,961 | 8/1972 | Muir | 324/34 D |
| 3,742,409 | 6/1973 | Santis et al. | 324/34 PS |
| 3,846,771 | 11/1974 | Young et al. | 176/19 R |
| 3,857,089 | 12/1974 | Adler et al. | 324/34 PS |
| 3,890,607 | 6/1975 | Pelenc et al. | 176/19 R |

OTHER PUBLICATIONS

"Handbook of Telemetry and Remote Control", Gruenberg Ed., McGraw-Hill Book Co., (6/15/73), pp. 11-20-11-22.
"Ref. Data for Radio Engineers" 5th Ed., Sams & Co., (3/69), pp. 32-2-32-5.

*Primary Examiner*—Charles T. Jordan
*Assistant Examiner*—S. A. Cangialosi
*Attorney, Agent, or Firm*—M. P. Lynch

[57] ABSTRACT

The coupling and decoupling of one or more of a plurality of differential transformers comprising a digital position probe assembly develops a phase encoded signal indicative of the position or level of a magnetically permeable element such as liquid metal or a lead screw in a nuclear reactor assembly. The phase encoded signal, which is developed as a Gray code, is processed in a phase decoder and digitally converted into a binary coded decimal to provide a digital representation of the level or position of the magnetically permeable material.

3 Claims, 23 Drawing Figures

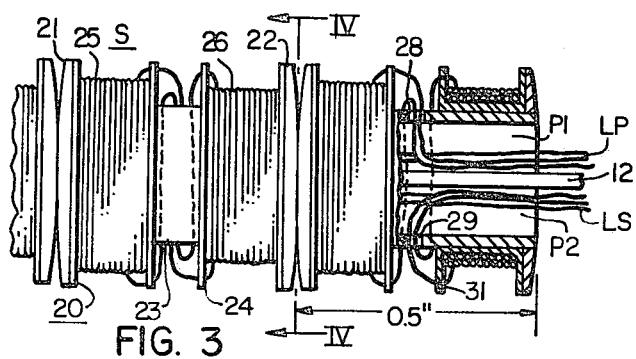
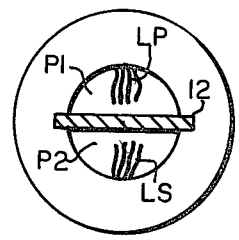
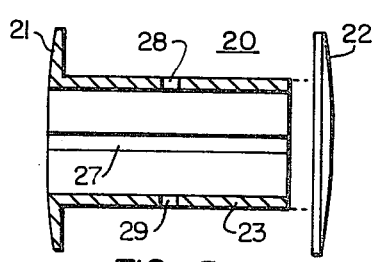
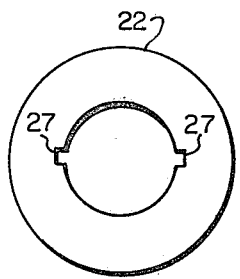
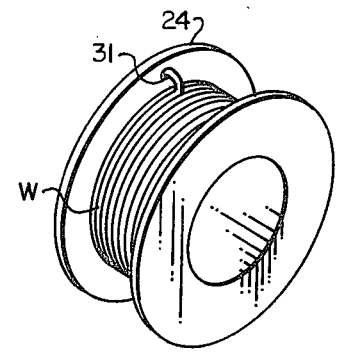
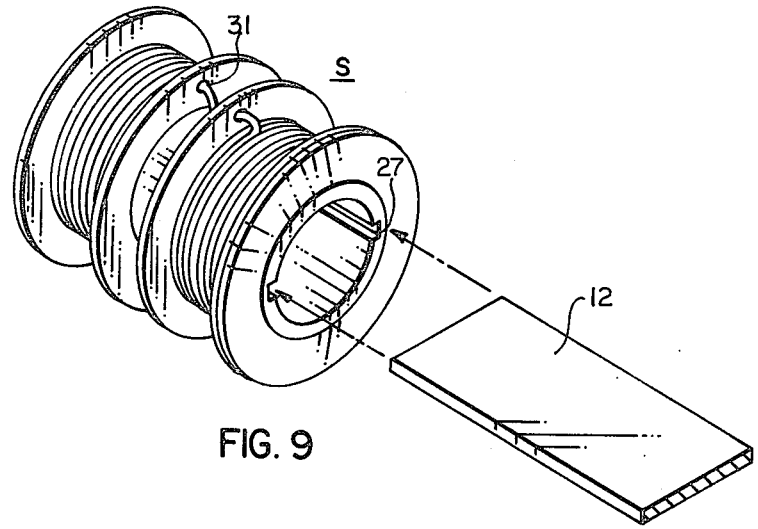

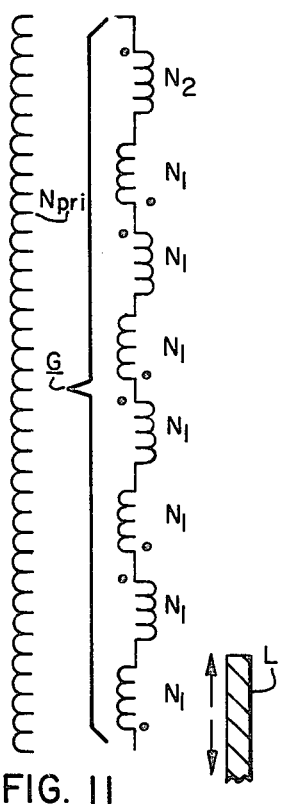
FIG. 11
$$N_2\ K_{min} = \frac{N_1}{2}(K_{max} + K_{min})$$
FIG. 12A
$$N_2\ K_{min} = \frac{N_1}{2}(K_{max} + K_{min})$$
FIG. 12B
$$N_2\ K_{max} = \frac{N_1}{2}\ \frac{K_{max}^2}{K_{min}} + K_{max}$$
FIG. 12C
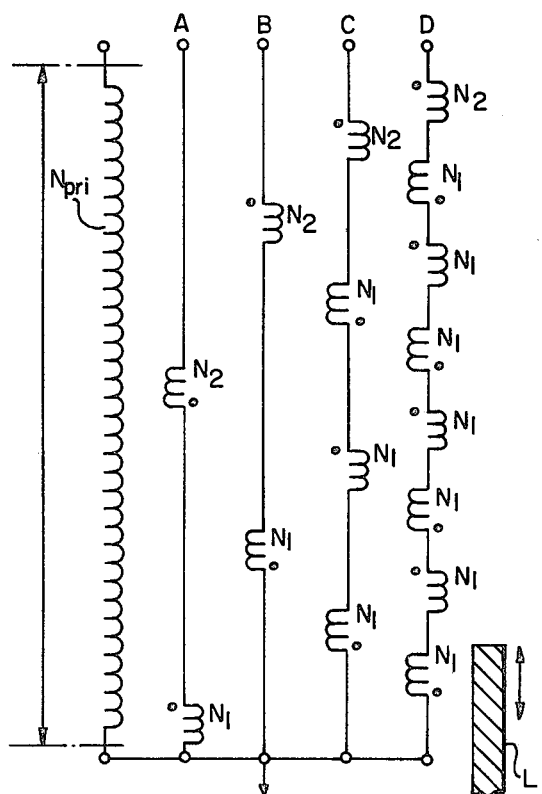
| A | B | C | D | |
|---|---|---|---|---|
| | | | | TOP |
| 1 | 0 | 0 | 0 | |
| 1 | 0 | 0 | 1 | |
| 1 | 0 | 1 | 1 | |
| 1 | 0 | 1 | 0 | |
| 1 | 1 | 1 | 0 | |
| 1 | 1 | 1 | 1 | |
| 1 | 1 | 0 | 1 | |
| 1 | 1 | 0 | 0 | |
| 0 | 1 | 0 | 0 | |
| 0 | 1 | 0 | 1 | |
| 0 | 1 | 1 | 1 | |
| 0 | 1 | 1 | 0 | |
| 0 | 0 | 1 | 0 | |
| 0 | 0 | 1 | 1 | |
| 0 | 0 | 0 | 1 | |
| 0 | 0 | 0 | 0 | |
| | | | | BOTTOM |
FIG. 13A  FIG. 13B

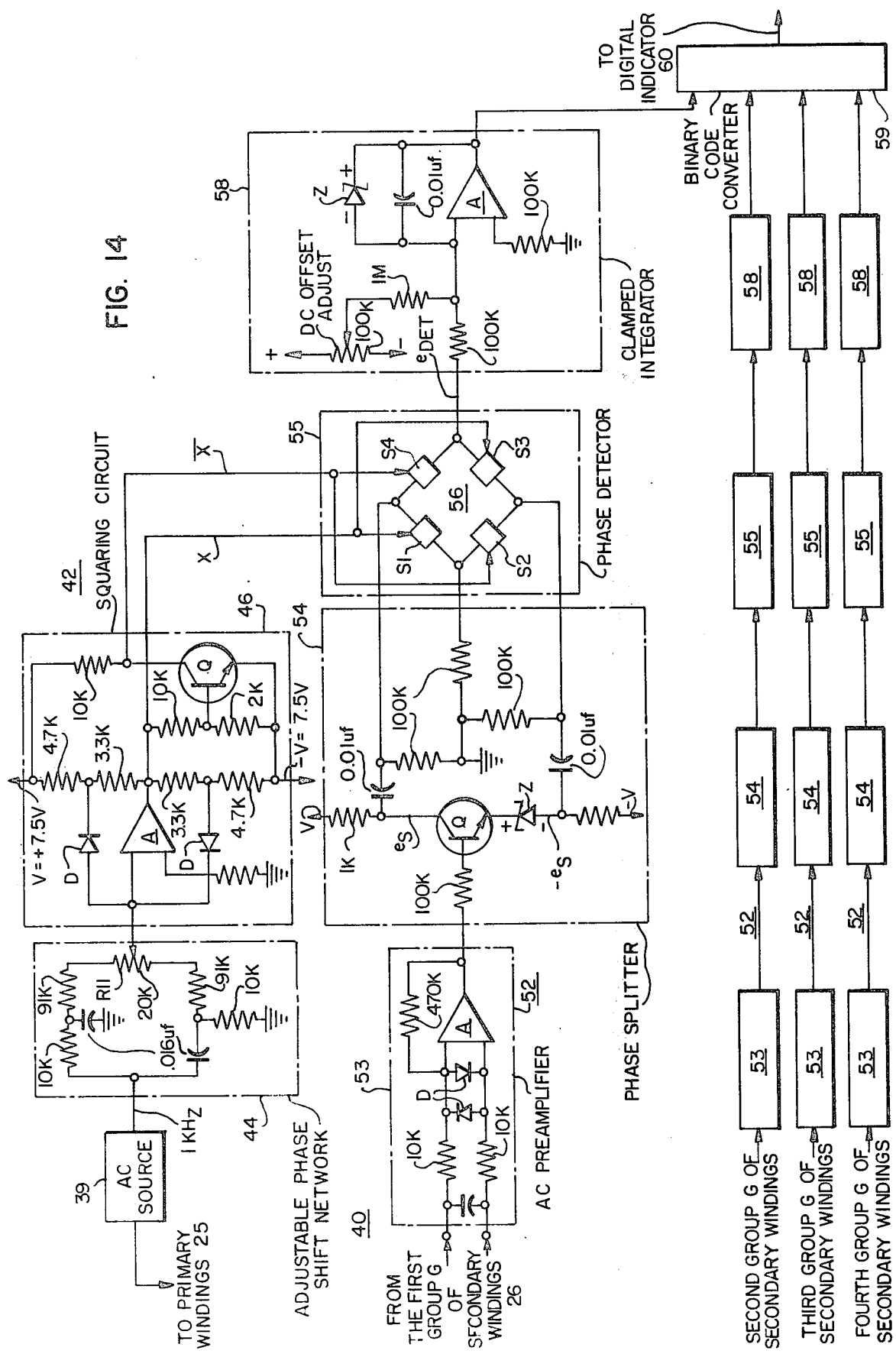

PHASE ENCODED DIGITAL POSITION PROBE ASSEMBLY

CROSS REFERENCE TO RELATED APPLICATION

This application is related to the co-filed, co-pending application Ser. No. 622,918, filed Oct. 16, 1978 entitled "A Flexible Position Probe Assembly", now U.S. Pat. No. 4,052,686 which is assigned to the assignee of the present invention. This application is directed to the mechanical components and design which, when assembled, form an elongated flexible probe.

BACKGROUND OF THE INVENTION

A major requirement for a versatile and stable position probe assembly exists in the nuclear reactor field where knowledge of the precise position of control rods affecting the position of nuclear fuel rods is essential. The critical requirements for control rod position indicators for use in nuclear reactor facilities extend to both the mechanical design as well as to the electrical readout.

Typically, the probe assemblies required for monitoring control rod position can vary in length from two to twelve feet, thus requiring substantial overhead clearance for installation. In many facility designs the overhead clearance required to accommodate conventional rigid control rod position probe assembly does not exist. Efforts to date to design a suitable sectionalized or flexible position probe assembly capable of being installed and removed from a reactor facility having a clearance less than the overall length of the probe have not proven to be totally reliable over an extended period of time.

In addition to the mechanical deficiencies of prior art position probe assemblies, the analog manifestation of the position indication developed by these probe assemblies have not proven satisfactory due to the adverse effects of temperature changes, line voltage and frequency variations, noise pick-up, and, interference from ambient magnetic fields.

There is disclosed herein with reference to the accompanying drawings a unique probe design capable of flexing in two planes for ease of installation in facilities with limited overhead clearance, and developing a phase encoded electrical indication of the position of a magnetically permeable material, and signal processing circuitry for converting said phase encoded signal to a direct digital indication of the position of the magnetically permeable material.

SUMMARY OF THE INVENTION

A flat flexible elongated strip is inserted through slots machined in the tubular passages of each of a plurality of tubular spools, on each of which is wound primary and secondary windings to form a core section. The length of the flexible strip and the number of core sections, wherein each core section may measure $\frac{1}{2}$ inch in length, positioned on the flexible band is a function of the required operational length of the probe assembly. The core sections are maintained in adjacent contacting relationship by a spring element at one end of the probe assembly. The spring element permits flexing of the probe assembly in either of two opposite directions defining a plane perpendicular to the surfaces of the flexible strip corresponding to the width of the flat flexible strip. The flat flexible strip effectively divides the tubular passages of each of the core sections in half, such that the alignment of adjacent core sections in contacting relationship about the flexible strip forms two longitudinal internal probe passages which are electrically isolated. Lead wires from the primary windings of the respective core sections extend through one of the internal passages to an external electrical terminal, while lead wires from the secondary windings of the respective core sections extend through the second internal probe passage to an external electrical terminal. The isolation of the primary and secondary leads within the longitudinal passages eliminates electrical interference, and further the routing of the electrical leads via the internal probe passages isolates electrical leads from adverse ambient conditions.

Typically, the movement of a predetermined magnetically permeable element or object, such as a control rod in a nuclear reactor installation, or a magnetically permeable liquid, such as a liquid metal, is monitored indirectly as a function of the coupling and decoupling of one or more of the plurality of differential transformer core sections comprising the position probe assembly. Since the successive coupling or decoupling of adjacent differential transformer core sections in response to movement of the magnetically permeable material, follows the dimensional length of each core section, the accuracy of position indication is directly related to the length dimension of the core section. For instance, if the length of each core section is $\frac{1}{2}$ inch, the resolution and accuracy of the position probe assembly will be approximately $\pm \frac{1}{2}$ inch of the actual position of the predetermined element. The output signal developed at the secondary windings of the plurality of differential transformer core sections form a phase encoded digital signal in Gray code, which is not a function of analog signal strength. This output signal format is inherently independent of line voltage and frequency variations, as well as variations in nuclear reactor operating temperatures. A Gray code pattern, instead of the more common binary code, is desirable for two reasons:

1. A conventional binary code changes more than one bit as the code progresses, thus leading to large errors when the timing of the bits is not perfect; the unique characteristic of the Gray code is that only one bit changes as the code progresses, and therefore erroneous timing of a bit only produces a single increment error, which in the case of a core section length of $\frac{1}{2}$ inch would correspond to a $\frac{1}{2}$ inch increment error.

2. The Gray code requires only one secondary coil per primary and core section, while the binary code would require multiple secondaries for each core section.

Signal processing circuitry converts the Gray code phase encoded digital output signals from the position probe assembly into a binary coded decimal format for numerical display of the position of the monitored magnetically permeable material.

BRIEF DESCRIPTION OF THE DRAWINGS

The invention will become more readily apparent from the following exemplary description in connection with the accompanying drawings:

FIGS. 3-9 are illustrations of components and combinations of components comprising the flexible position probe assembly of FIG. 2;

FIG. 11 is a simplified schematic illustration of a typical interconnection scheme of the primary and secondary windings of the differential transformers of the flexible position probe assembly of FIG. 2 to produce a phase encoded digital output signal;

FIGS. 12A, 12B and 12C are phasor diagrams illustrating the operation of the windings of FIG. 11 to produce a phase encoded output signal;

FIG. 13A is a schematic illustration of a secondary winding interconnect scheme to produce a 4 bit Gray code;

FIG. 13B is a truth table corresponding to FIG. 13A;

FIG. 14 is a schematic illustration of signal processing circuitry connected to the windings of said flexible position probe assembly to develop a digital output indication of the position of a predetermined object or material monitored by the flexible position probe assembly of FIG. 2.

DESCRIPTION OF THE PREFERRED EMBODIMENT

Figure 1:
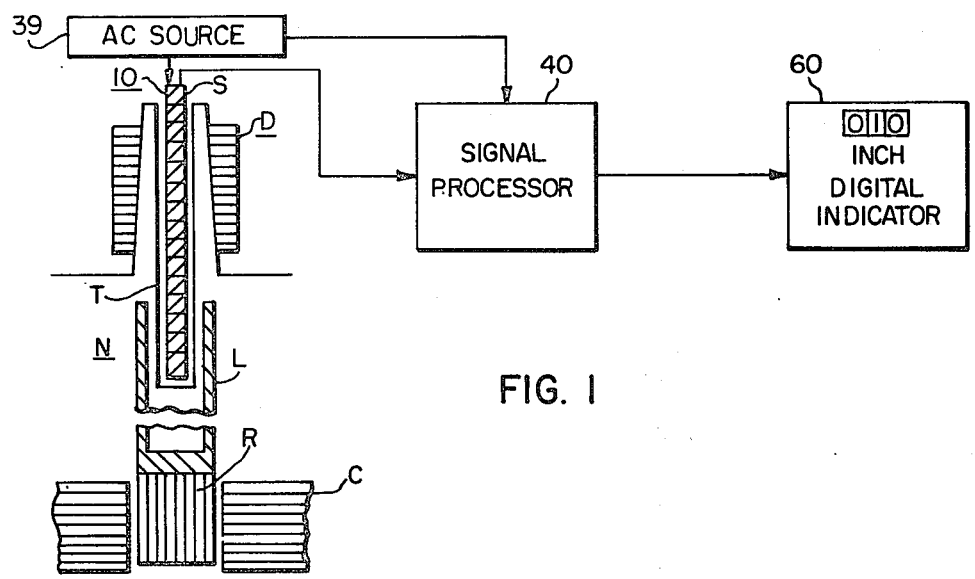
FIG. 1 is a schematic illustration of an application of the preferred embodiment of the invention.

While numerous applications of the invention exist, including the monitoring of liquid levels, the preferred embodiment chosen for illustrating the flexible position probe assembly and associated electronics is that of a nuclear reactor application as illustrated in FIG. 1, wherein the flexible position probe assembly 10 responds to the movement of lead screw L to develop an output signal indicative of the position of control rod R. The position probe assembly 10 is installed in a nonmagnetic thimble T, typically stainless steel, within the control rod drive mechanism (CRDM) D of the nuclear reactor assembly N. The lead screw L, to which the actual control rod R is attached, is constructed of a magnetically permeable material such as steel. The lead screw L is hollow and moves upwards and downwards over the thimble T as the control rod R is raised and lowered relative to the reactor core C. As discussed above, the flexible position probe assembly 10 consists of a plurality of differential transformer core sections S, each including primary and secondary windings. The primary windings of the sections S respond to excitation current from an AC source 39 by generating a magnetic flux field which is engaged by that portion of the lead screw L adjacent to core sections S. With the control rod R fully inserted in the reactor core C as illustrated, the lead screw L couples only the lower sections S of the probe assembly 10. By design, with the control rod R fully raised, all differential transformer core sections S of the probe assembly 10 would be coupled by the lead screw L. Thus, the output signal supplied from the flexible probe assembly 10 to the signal processing circuitry 40 is in direct relation to the change in transformer coupling produced by the movement of lead screw L and is thus an actual indication of the position of control rod R. The signal processing circuitry responds to the output signals from the flexible position probe assembly 10 by transmitting digital signals to digital indicator 60 which provides a direct numerical indication of the position of control rod R.

Figure 2:
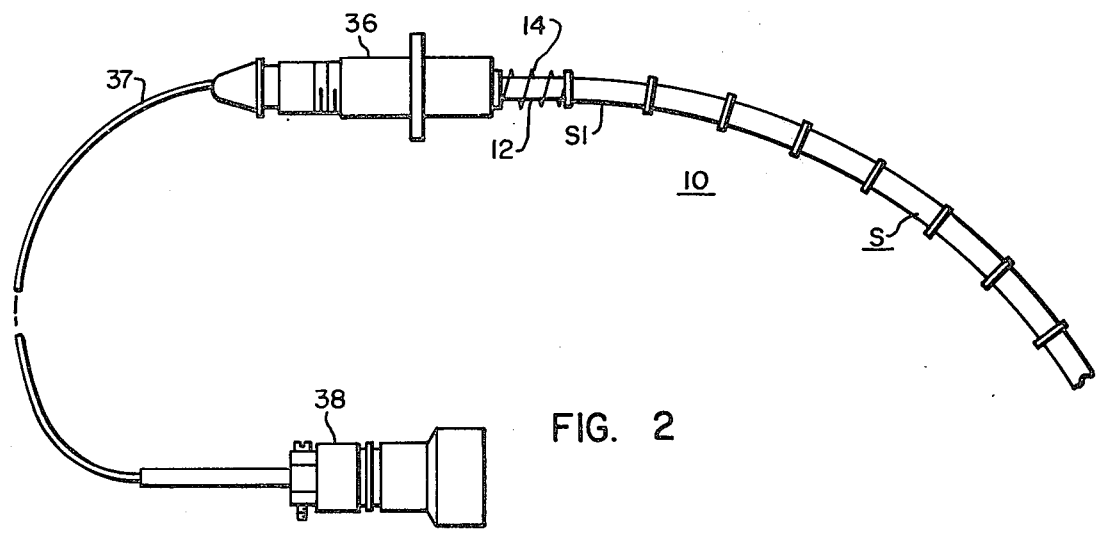
FIG. 2 is an illustration of the novel flexible position probe assembly.

The flexible probe assembly as described above is pictorially represented in FIG. 2 wherein the flex capability of the probe is clearly apparent. A flat flexible band or strip 12, typically constructed from spring steel, is inserted through a plurality of tubular differential transformer core sections S with the electrical leads associated with the respective primary and secondary windings exiting through the internal passages defined in the core sections S by the flexible band 12 for termination at electrical terminal 36. The combination of cable 37 and electrical connection 38 provides electrical connection between the probe assembly 10 and the signal processing circuitry 40.

Spring member 14 positioned between electrical terminal assembly 36 and the uppermost core section S1 permits displacement of the relative core section S along the flexible band 12 during flexing of the probe assembly 10.

Referring to FIGS. 3-9, there is illustrated the components comprising the core sections S and the combination of the core sections S with the flexible band 12 to form the flexible position probe assembly 10. The core sections S consist of a tubular spool 20, typically constructed of annealed stainless steel having uniform permeability, having end flanges 21 and 22 and a tubular member 23 extending therebetween. The outside surfaces of the end flanges 21 and 22 are beveled, as shown, such that adjacent core sections S, as illustrated in FIG. 3, are free to move with respect to one another in response to the flexing action of the probe assembly 10. The primary winding 25 and the secondary winding 26 of each core section are wound on appropriate coil retainers 24 for positioning on the spool member 23, as shown in FIG. 3. The spool member 23 further includes longitudinal grooves 27 which are broached into the interior surface of the tubular spool member 23 in order to accommodate the flexible strip 12. The insertion of the flexible strip 12 through the core sections S as illustrated in FIGS. 3, 4 and 9 defines the internal probe passages P1 and P2. Apertures 27 and 28 in the tubular member 23 of each spool 20 provide communication with internal passages P1 and P2, respectively. The electrical leads associated with each of the primary windings 25 of the core sections S extend through interior passage P1 to the electrical connector 36 of FIG. 2, while the electrical leads associated with the secondary windings 26 of the core sections S extend through internal passage P2 to the electrical terminal 36. In an application where it is desired to measure the position or displacement of an object such as the control rod R in $\frac{1}{2}$ inch increments, the length dimension of the core sections S which corresponds to the length dimensions of the spools 20 would be $\frac{1}{2}$ inch, as indicated in FIG. 3. Needless to say, this dimension can be varied as dictated by a particular application.

Figure 8:
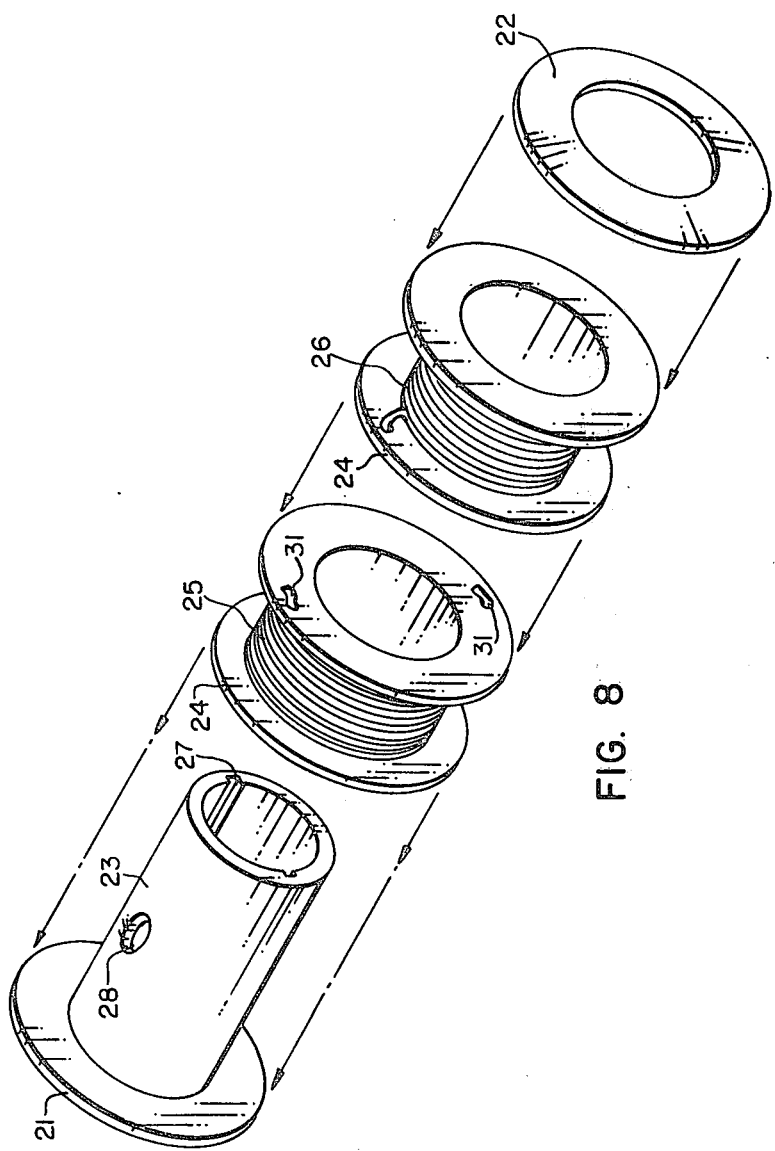

The design of the spool 20 is illustrated in detail in FIGS. 5 and 6. The assembly of a core section S, comprising a pair of coil retainers 24, as illustrated in FIG. 7, accommodating the primary and secondary windings 25 and 26, is accomplished as illustrated in the exploded view of FIG. 8. End flange 21 is force-fitted onto tubular element 23, as illustrated in FIGS. 5 and 8 and the coil retainers 24 for primary and secondary windings 25 and 26 are slid onto the tubular member 23 and the end flange 22 is then secured in a force-fitting relationship with the tubular member 23 to produce a core section S. The ends of the primary winding 25 and the secondary winding 26 extend through a wall of the respective retainers 24 to terminals 31. The primary lead wires LP and the secondary lead wires LS, as illustrated in FIG. 3, are then fed through apertures 28 and 29 in the tubular element 23 for termination at the appropriate coil terminals 31. The use of the coil retainers 24 is a matter of convenience. They can be fabricated from any suitable material such that the primary and secondary coil windings of appropriate number of turns can be assembled as a separate component, as illustrated in FIGS. 7 and 8, for ease of assembly to form core sections S. The interconnection of the primary and secondary windings of the respective core sections S can be such as to satisfy desired electrical operation. In the embodiment illustrated, the primary windings of adjacent core sections S are connected in a series arrangement, while the secondary windings 26 are interconnected in sets of parallel combinations, as will be discussed hereinafter.

The design of the independent core sections S and the mechanical combination of the core sections S with the flexible strip 12 provide a flexible position probe assembly 10 capable of developing digital output position indication substantially independent of ambient magnetic fields, temperature variations and changes in line voltage and frequency. The degree and radius of the flex capabilities of the position probe assembly is a function of the characteristics of the flexible strip 12, the length of the respective core sections S and the overall length of the position probe assembly 10. The beveled design of the adjacent contacting surfaces of the spools 20 support flexing of about 10° between any two adjacent core sections S. A position probe assembly of 24 inches in length will typically permit flexing of the probe assembly into an arc defining a radius of less than 15 inches. This flex characteristic of the position probe assembly 10 permits installation of the position probe assembly 10 in applications, i.e., such as the nuclear reactor application of FIG. 1, wherein the overhead clearance is less than the required length of the position probe assembly.

Figure 10:
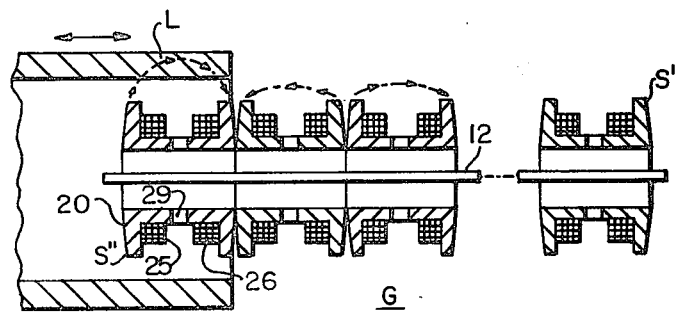
FIG. 10 is a sectioned illustration of the flexible probe assembly of FIG. 2.

The mode of operation of the position probe assembly 10 is illustrated in FIGS. 10 and 11 wherein the individual core sections S which comprise differential transformers, develop an output signal at the secondary winding which varies in response to magnetic coupling and decoupling occurring between the core sections S and the lead screw L, as the lead screw L moves in combination with the control rod R. The output signal resulting from the predetermined electrical combination of the secondary windings of the core sections S is supplied through signal processing circuitry 40 to digital indicator 60 to manifest the position of control rod R.

In the embodiment illustrated in FIGS. 10 and 11 the primary windings 25 are connected in series with alternative reversed polarity so as to generate a number of individual magnetic fields with alternate polarization along the length of the probe assembly 10. Assuming that the core sections S are each approximately ½ inch in length, then the alternating polarized fields will be approximately ½ inch in length. The secondary coils 26 are connected in a series-parallel pattern to generate four independent outputs, which together form a phase encoded digital signal in Gray code. The number of series group and thus the number of independent outputs forming the signal is merely a design choice. Each series-connected group G of secondary windings 26, as schematically illustrated in FIG. 11, consists of an even number of alternately opposite polarized coils, forming a large differential transformer. While the number of turns for the primary and secondary windings of each group is a function of design choice and the permeability of the control rod drive mechanism D, the number of turns per primary winding is identical, i.e., 40, while the number of turns per secondary winding, with the exception of either the bottommost or uppermost secondary winding in each series group of secondary windings, is also of an equal number of turns, i.e., 80 turns. If the secondary winding of the lowermost core section S″ in a group G is selected to have a different number of turns than the remaining secondary windings of the group G, the fact that the secondary winding or lowermost core section S″ will be the first in the respective group to be coupled by the lead screw L and the last to be decoupled, a number of turns less than 80, such as 65 turns, will provide the appropriate phase change in the output signal developed by the group G in response to movement of the lead screw L. In the event the secondary winding associated with the uppermost core section S′ of the group G of FIG. 10 is selected to consist of a different number of turns from the remaining secondary windings of the group G, the number of turns associated with the secondary winding of the core section S′ is typically greater than 80 turns, i.e., 100 turns, inasmuch as core section S′ is the last to be coupled by the lead screw L as it advances upward and the first to be decoupled by the lead screw L as the lead screw retracts. The phase and magnitude of the respective voltages developed by the secondary winding of the core section S′ with respect to secondary windings of the remaining core sections is such as to develop an output signal from the group G which serves as a phase encoded output which combines with the output voltages developed by the remaining three groups to form a Gray code output from the probe assembly 10. This latter arrangement, wherein the uppermost core section S′ of the respective groups of series connected secondary windings is chosen for the purposes of illustrating and describing the disclosed embodiment of the invention.

The Gray code is a unit-increment code, sometimes also referred to as the cyclic code or the reflected-binary code. Gray codes, which have the characteristic of changing the state of only one bit from one numeral to the next, are used extensively in position encoders because the maximum reading error during the transition from one incremental position to the next is the adjacent numeral. If a coventional binary 8 4 2 1 code were used for position and coding, all bits to be changed must change at precisely the same position to avoid large error outputs during such transitions as 3 to 4 and 7 to 8. This precision usually imposes unreasonable mechanical tolerances in the fabrication and assembly of position monitoring devices such as the probe assembly 10. Detail discussion of Gray codes and techniques for converting Gray codes to binary code are presented in the following published texts:

"Electronic Analog/Digital Conversions", by Hermann Schmid; Van Nostrand Reinhold Company (1970);

"Analog-to-Digital/Digital-to-Analog Conversion Techniques", by David F. Hoeschele, Jr.; John Wiley and Sons, Inc. (1968);

"Digital Electronics for Scientists", by H. V. Malmstadt and C. G. Enke; W. A. Benjamin, Inc. (1969).

A comparison of a conventional Gray code with a conventional pure binary code as presented on page 305 in the above-described text "Electronic Analog/Digital Conversions" is given in the following table:

| Decimal | Gray Code | | | | Pure-Binary Code (two's complement) | | | |
|---|---|---|---|---|---|---|---|---|
| +7 | 1 | 0 | 0 | 0 | 0 | 1 | 1 | 1 |
| +6 | 1 | 0 | 0 | 1 | 0 | 1 | 1 | 0 |
| +5 | 1 | 0 | 1 | 1 | 0 | 1 | 0 | 1 |
| +4 | 1 | 0 | 1 | 0 | 0 | 1 | 0 | 0 |
| +3 | 1 | 1 | 1 | 0 | 0 | 0 | 1 | 1 |
| +2 | 1 | 1 | 1 | 1 | 0 | 0 | 1 | 0 |
| +1 | 1 | 1 | 0 | 1 | 0 | 0 | 0 | 1 |
| 0 | 1 | 1 | 0 | 0 | 0 | 0 | 0 | 0 |
| −1 | 0 | 1 | 0 | 0 | 1 | 1 | 1 | 1 |
| −2 | 0 | 1 | 0 | 1 | 1 | 1 | 1 | 0 |
| −3 | 0 | 1 | 1 | 1 | 1 | 1 | 0 | 1 |
| −4 | 0 | 1 | 1 | 0 | 1 | 1 | 0 | 0 |
| −5 | 0 | 0 | 1 | 0 | 1 | 0 | 1 | 1 |
| −6 | 0 | 0 | 1 | 1 | 1 | 0 | 1 | 0 |
| −7 | 0 | 0 | 0 | 1 | 1 | 0 | 0 | 1 |
| −8 | 0 | 0 | 0 | 0 | 1 | 0 | 0 | 0 |

The individual core sections S of the probe assembly illustrated in FIGS. 10 and 11 represent individual transducers which can be considered as transformers with relatively poor coupling to the secondary windings. In the absence of coupling by the lead screw L, each of the transducers represented by the core sections S exhibits a minimum coupling coefficient $K_{min}$, i.e., 0.06 whereas coupling of the core sections S by the lead screw L increases the coupling coefficient to $K_{max}$, i.e., 0.09.

The $K_{min}$ and $K_{max}$ coupling coefficients are actually analog equivalent coupling coefficients derived from a number of adjacent core sections. Since the end core sections of the group G do not have adjacent core sections on both sides, their coupling coefficient differs slightly from that of a core section in the middle of the group G.

In the embodiments of FIGS. 10 and 11, $N_1$ represents the turns of the secondary windings of the group G with the exception of the uppermost core section S' wherein the turns of the secondary winding shall be identified as $N_2$. The turns $N_{pri}$ of the series connected primary windings 25 of the group G are excited with a constant AC current supplied by AC source 39.

Referring to FIG. 11, the even number of secondary windings comprises the group G are schematically illustrated in a series-opposition arrangement wherein the turns $N_2$ of the secondary winding of the uppermost core section can be expressed in terms of the turns $N_1$ of the other secondary windings in the group G as follows:

$$N_2 = N_1/2 \; (K_{max}/K_{min} + 1)$$

When the lead screw L is totally retracted and thus provides no coupling of the lowermost core section S" of the group G, a minimum coupling condition exists for the group G wherein the resultant phase voltage $V_R$, which is depicted in the phasor diagram of FIG. 12A, can be represented as:

$$V_R = N_1/2 \; (K_{max} - K_{min})$$

For the purposes of discussion it will be assumed that this resultant phase voltage is positive and corresponds to a logic 0.

When the lead screw L advances to couple the lowermost core section S" of the group G, the resultant phase voltage $V_R$, which is illustrated in the phasor diagram of FIG. 12B, can be represented as:

$$V_R = -N_1/2 \; (K_{max} - K_{min})$$

This negative resultant phase voltage $V_R$ occurring when the lowermost core section S" is coupled by the lead screw L corresponds to a logic 1. As the lead screw L continues to advance and sequentially couples adjacent core sections, the resultant output voltage alternates between a logic 0 and a logic 1 as described above. With the selection of an even number of core sections and corresponding secondary windings in the group G, when the lead screw L couples the uppermost core section S', the resultant voltage $V_R$, which is developed in accordance with the phasor diagram of FIG. 12C, is positive, thus corresponding to a logic 0, and can be represented as follows:

$$V_R = N_1/2 \; (K_{max}/K_{min}) \; (K_{max} - K_{min})$$

A simplified schematic illustration of the interconnection of primary and secondary windings of core sections S comprising a probe assembly in accordance with the teachings of this invention is illustrated in FIG. 13A, while the corresponding four bit Gray code is presented in the truth table of FIG. 13B.

Inasmuch as the output signal developed by the position of assembly 10 is a phase related signal, and not a parameter of any analog signal strength, the operation of the position probe assembly 10 is substantially independent of line voltage and frequency variations and, in a nuclear reactor application, such a probe is substantially independent of reactor operating temperature fluxations.

There are numerous techniques known in the art for implementing the operation of signal processor circuit 40 to convert the Gray code output of the probe assembly 10 to a binary coded decimal suitable for digital display of the position of lead screw L in the digital indicator circuit 60. Typical techniques for converting Gray code information into binary code information are disclosed on page 313 of the above-referenced text "Electronic Analog/Digital Conversions" and page 335 of the above-referenced text "Analog-to-Digital/Digital-to-Analog Conversion Techniques".

An implementation of typical circuitry to satisfy the operation of the signal processor circuit 40 is schematically illustrated in FIG. 14.

The signal processing circuitry 40 consists of a drive circuit 42, four identical signal processing channels 52 connected to produce a binary output corresponding to the output of the respective secondary winding groups for conversion by the binary code converter circuit 59 to provide a control rod position indication on the digital indicator 60.

Figure 15A:
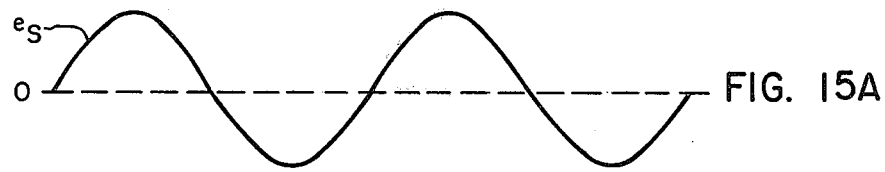
FIGS. 15A-15F are waveform illustrations of the operation of the circuitry of FIG. 14.
Figure 15B:
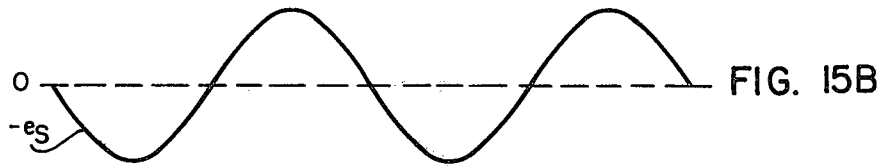
Figure 15C:
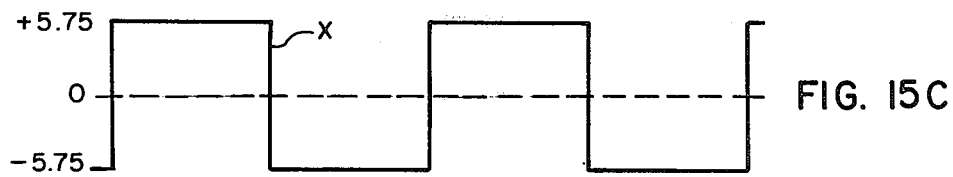
Figure 15D:
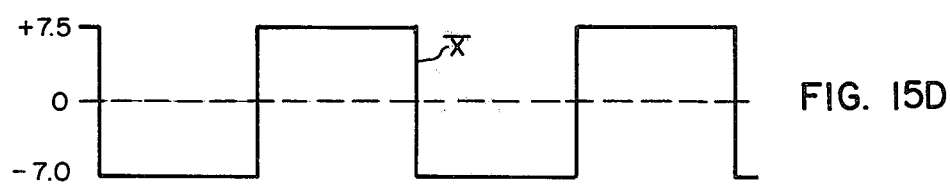
Figure 15E:
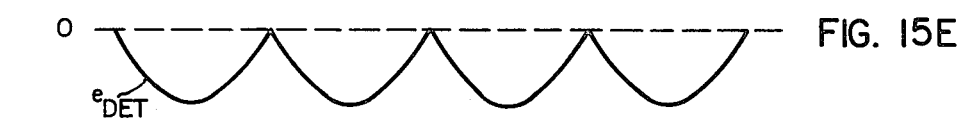

The AC source 39, which can be implemented typically through the use of a Wein bridge oscillator, produces a one kilohertz excitation signal which is applied both to the primary windings 25 and the adjustable phase shift network 44 which consists of the resistive and capacitive components as illustrated in FIG. 14. The adjustable phase shift network 44 functions to compensate for unavoidable phase shifts introduced by the AC source 39 and the position probe assembly 10. After appropriate phase shift compensation has been provided by the positioning of adjustable resistor R1, the output signal developed at resistor R1 is supplied to the operational amplifier A of the squaring circuit 46. The operational amplifier A, in combination with the diodes D, the transistor Q, and the resistive components as indicated, functions to amplify and clip the output signal developed by the adjustable phase shift network 44 and produce reference square wave outputs X and the complement of X, square wave $\bar{X}$, which reference waveforms are illustrated in FIGS. 15C and 15D.

Inasmuch as each of the signal processing channels 52 associated with respective groups G of secondary winding, is identical, the circuitry associated with the signal processing channel 52 connected to the first group G of secondary windings 26 is illustrated in detail. It is apparent that the circuitry and operation of the signal processing channel 52 illustrated in detail, will apply identically to the signal processing channels 52 associated with the second, third and fourth group G of secondary windings.

Figure 15F:

The output signals developed by the first group G of secondary windings are amplified by the AC preamplifier circuit 53, which consists of operational amplifier A, diodes D and the resistive and capacitive components as illustrated. The amplified output of the AC preamplifier circuit 53 is supplied as an input signal to the phase splitter circuit 54. The phase splitter circuit 54, which includes transistor Q, Zener diode Z, and the resistive and capacitive components as illustrated, functions to split the input signal into the opposite polarity AC signals $e_S$ and $-e_S$ as illustrated in FIGS. 15A and 15B respectively. The AC signals $e_S$ and $-e_S$ which correspond to the output signals of the first group G of secondary windings are supplied as input signals to the phase detector circuit 55 herein illustrated as consisting of a four arm bridge arrangement including four bilateral switches S1, S2, S3, and S4. The drive signals applied to the bilateral switches correspond to the phase adjusted square wave reference signals X and $\bar{X}$ developed by the drive circuit 42. Each of the bilateral switches of phase detectors circuit 55 operates similarly to a relay contact in that when the control signals corresponding to the square wave reference signals X and $\bar{X}$ applied to the respective bilateral switches are positive, the bilateral switch exhibits a low impedance, i.e., 300 ohms, whereas when the applied drive signal is negative, the bilateral switch exhibits a high impedance between its input and output terminals. The phase detector circuit 55 can be implemented through the use of commercially available circuits such as the RCA type CD 4066A. The operation of the phase detector circuit 55 to develop the output signal $e_{Det}$, which is supplied as an input to the clamped integrator circuit 58, is developed in accordance with the operation of phase detector circuit 55 as depicted in the waveforms of FIGS. 15A–15F. The $e_{Det}$ output signal corresponds to the phase relationship between the reference signals X and $\bar{X}$ and the signals $e_S$ and $-e_S$. When, for the purpose of discussion, square wave reference signal X is positive and square wave reference signal $\bar{X}$ is negative, the output signal $e_{Det}$ of phase detector 55 corresponds to the rectified representation of signal $-e_S$ illustrated in FIG. 15E. In the situation where the square wave reference signal X is negative and the square wave reference signal $\bar{X}$ is positive, the rectified representation of signal $e_S$ as illustrated in FIG. 15F forms the output signal $e_{Det}$. The clamped integrator circuit 58, which consists of operational amplifier A, Zener diode Z, DC offset adjustable resistor R2 and the remaining resistors and capacitors as shown, functions to average the output signal $e_{Det}$ of phase detector circuit 55 and provide a logic level "1" or "0" as determined by the polarity of the output signal $e_{Det}$. The logic level output of the clamped integrator circuit 58 is supplied as the input to the binary code converter circuit 59, which responds to similar inputs from the signal processing channels 52 associated with remaining groups G of secondary windings to develop a binary coded output signal which when applied to the digital indicator circuit 60 results in the digital display of the position of control rod R of FIG. 1.

We claim:

1. A digital probe assembly for monitoring the level or position of a magnetically permeable material, comprising, an elongated probe member consisting of a plurality of core sections aligned in an end-to-end relationship, each core section having coil turns forming a primary and secondary winding thereabout to form a transformer, the voltage signal induced in said secondary winding in response to AC excitation of said primary winding changing in response to magnetic coupling and decoupling produced by the presence and absence respectively of a magnetically permeable material in a position adjacent to said respective transformers, said secondary windings being divided to form several groups of secondary windings, the secondary windings of the respective groups being series connected in an alternately opposed polarity arrangement, an end winding in each series connected group of secondary windings having a different number of coil turns than the remaining secondary windings of the group, the number of coil turns in each of the remaining secondary windings being substantially identical, the inclusion of said end secondary winding having a number of coil turns different from the number of coil turns of the remaining secondary windings in the respective group resulting in the development of a phase related output signal from the respective secondary winding groups in response to change in the level or position of the magnetically permeable material, and signal processing circuitry connected to said groups of secondary windings for processing said phase related output signals developed by the respective groups of secondary windings to produce a digital indication of the position or level of said magnetically permeable material.

2. A digital probe assembly for monitoring the level or position of a magnetically permeable material, comprising, an elongated probe member consisting of a plurality of core sections aligned in an end-to-end relationship, each core section having coil turns forming a primary and secondary winding thereabout to form a transformer, the voltage signal induced in said secondary winding in response to AC excitation of said primary winding and in response to magnetic coupling and decoupling produced by the presence and absence respectively of a magnetically permeable material in a position adjacent to said respective transformers, said secondary windings being divided to form several groups of secondary windings, the secondary windings of the respective groups being series connected in an alternately opposed polarity arrangement, an end winding in each series connected group of secondary windings having a different number of coil turns than the remaining windings of the group, the number of coil turns in each of the remaining secondary windings being substantially identical, the inclusion of said secondary winding having a number of coil turns different from the number of coil turns of the remaining secondary windings in the respective groups resulting in the development of a phase related output signal from the respective secondary winding groups in response to change in the level or position of the magnetically permeable material, and signal processing circuitry connected to said groups of secondary windings for processing said phase related output signals developed by the respective groups of secondary winding to produce a digital indication of the position or level of said magnetically permeable material, said signal processing circuitry including separate signal processing channels operatively connected to each of said groups of secondary windings, each of said signal processing channels including a square wave reference source for developing a first square wave output and a second square wave output which is the compliment of the first square wave output, a phase splitter circuit means for splitting the output signal developed by the groups of secondary windings into opposite polarity AC signal components, a phase detector circuit means responsive to the output signals of said reference square wave source and said phase splitter circuit means to develop output signal corresponding to the phase relationship between the output signals of said square wave reference source and said phase splitter circuit means, and an integrator circuit means for averaging the output signals developed by said phase detector circuit means to develop a logic level output indicative of the polarity of the output signal of said phase detectors circuit means.

3. A digital probe assembly as claimed in claim 2 wherein said signal processing circuitry further includes a binary code converter circuit means for converting the logic level outputs of the respective integrator circuit means into a binary coded output signal indicative of the position or level of said magnetically permeable material.

* * * * *